US00RE37396B1

(19) United States
(12) Reissued Patent
Fogal

(10) Patent Number: US RE37,396 E
(45) Date of Reissued Patent: Oct. 2, 2001

(54) SEMICONDUCTOR WIRE BONDING METHOD

(75) Inventor: Rich Fogal, Boise, ID (US)

(73) Assignee: Micron Technology, Inc., Boise, ID (US)

(21) Appl. No.: 08/721,505

(22) Filed: Sep. 26, 1996

Related U.S. Patent Documents

Reissue of:
(64) Patent No.: 5,350,106
Issued: Sep. 27, 1994
Appl. No.: 08/059,971
Filed: May 7, 1993

(51) Int. Cl.[7] ..... H01L 21/603
(52) U.S. Cl. ..... 228/103; 228/105; 228/180.5
(58) Field of Search ..... 228/103, 105, 228/180.5, 9, 10

(56) References Cited

U.S. PATENT DOCUMENTS

| | | | | |
|---|---|---|---|---|
| 3,894,671 | | 7/1975 | Kulicke, Jr. et al. | 228/4.5 |
| 4,441,205 | | 4/1984 | Berkin et al. | 382/8 |
| 4,671,446 | * | 6/1987 | Sherman | 228/105 |
| 4,813,588 | * | 3/1989 | Srivastava et al. | 228/105 |
| 4,853,968 | * | 8/1989 | Berkin | 382/8 |
| 4,877,173 | | 10/1989 | Fujimoto et al. | 228/1.1 |
| 4,886,200 | | 12/1989 | Tsumura | 228/1.1 |
| 4,899,207 | | 2/1990 | Hallowell et al. | 357/70 |
| 4,951,120 | | 8/1990 | Hagiware et al. | 357/70 |
| 4,978,050 | * | 12/1990 | Amador | 228/105 |
| 4,979,663 | | 12/1990 | Sofia et al. | 228/180.2 |
| 5,082,165 | | 1/1992 | Ishizuka | 228/179 |
| 5,097,406 | * | 3/1992 | Narasimhan et al. | 228/105 |
| 5,111,989 | | 5/1992 | Holdgrafer et al. | 228/110 |
| 5,119,436 | * | 6/1992 | Holdgrafer | 382/8 |
| 5,137,201 | | 8/1992 | Yamazaki et al. | 228/103 |
| 5,176,311 | | 1/1993 | Levine et al. | 228/179 |
| 5,205,463 | * | 4/1993 | Holdgrafer et al. | 228/180.5 |
| 5,238,174 | * | 8/1993 | Ricketson et al. | 228/105 |
| 5,404,047 | * | 4/1995 | Rostoker et al. | 257/786 |

FOREIGN PATENT DOCUMENTS

| | | | | |
|---|---|---|---|---|
| 56-51835 | * | 5/1981 | (JP) | 228/105 |
| 01183127 | * | 7/1989 | (JP) | 228/105 |

OTHER PUBLICATIONS

Surface Mount Technology, "How to Use Integral Vision And Reflow for Placement of Fine Pitch SMC's", Spigarelli, Feb. 1987, pp. 31, 32.*

IBM Technical Disclosure Bulletin "Machine Vision Technique for Increasing the Integrity of Chip Alignment Data", vol. 34, No. 10B, pp. 129–131, Mar. 1992.*

* cited by examiner

*Primary Examiner*—Samuel M. Heinrich
(74) *Attorney, Agent, or Firm*—TraskBritt

(57) ABSTRACT

An improved method for teaching the location of a bond site on a selected lead finger of a semiconductor leadframe during a wire bonding process is provided. Initially, the location of the lateral edges and terminal edge of a tip portion of the lead finger is sensed by an automated vision system of a wire bonding apparatus. A width (W) and a longitudinal axis of the lead finger are then determined. The bond site is located along the longitudinal axis a predetermined distance of (W/2) from the terminal edge of the lead finger. The improved method allows greater accuracy in the placement of bond sites and precisely controls the length of the bond wire used during the wire bonding process.

13 Claims, 1 Drawing Sheet

SEMICONDUCTOR WIRE BONDING METHOD

Matter enclosed in heavy brackets [ ] appears in the original patent but forms no part of this reissue specification; matter printed in italics indicates the additions made by reissue.

FIELD OF THE INVENTION

The present invention relates to semiconductor manufacturing and specifically to semiconductor wire bonding processes. More particularly, the present invention relates to an improved method for teaching the location of a bond site on a lead finger of a leadframe during a wire bonding process.

BACKGROUND OF THE INVENTION

In semiconductor manufacture a wire bonding process is used to electrically connect bond pads formed on semiconductor dice to the lead fingers of a [leadfree] *leadframe* strip. Apparatus for wire bonding semiconductor dice are well known in the art. U.S. Pat. No. 3,894,671 to configuration which matches the peripheral configuration of a semiconductor die. Mounting paddle connecting members 58 attached to the strip rails 34 connect and support mounting paddles 32 on the [leadfree] *leadframe* strip 30.

The bond wire is typically a fine gold or copper wire that is threaded through the bonding tool. The end of the wire is heated by an electrical discharge or a hydrogen torch to a molten state. This forms a ball of molten metal on the end of the bond wire. For bonding a selected bond pad of the heated die, the molten ball is pressed by the bonding tool against the bond pad. This mechanically bonds the bond pad and the bond wire to one another. The bonding tool is then moved over a bonding site on a selected lead finger and the heated bond wire is pressed against the bond site. This mechanically bonds the bond wire and the lead finger to one another. The bond wire is then tensioned and sheared. This process is repeated for each bond pad on the die.

A critical requirement of the wire bonding process is precisely locating the bonding tool with respect to each bonding pad and to a bond site of an appropriate lead finger. Earlier versions of wire bonding apparatus were manually operated by an operator viewing the semiconductor dice through a microscope to precisely locate the bonding tool. More recently, automated wire bonding apparatus include vision systems for automatically sensing the locations of the bond pads on the dice and lead fingers of the leadframe to automatically perform the wire bonding process. U.S. Pat. No. 4,441,205 to Berkin et al. discloses a representative vision system for wire bonding apparatus.

In general, such vision systems are adapted to sense the lateral edges of the lead fingers and to teach a bond site in the middle of the lead finger somewhere along the longitudinal axis of the lead finger. There is, however, no provision for precisely locating the bond site on a lead finger an exact distance from the tip of the lead finger. Typically, the bonding tool is programmed by an operator to move a set distance away from the bond pad for placing the bond site along the longitudinal axis of a lead finger. This is not an accurate or consistent method for teaching a bond site location on a lead finger. In addition, this method of locating a bond site tends to use more bond wire than is necessary because the length of the bond wire is consistently oversized.

This situation is shown in FIG. 1. With reference to FIG. 1, a semiconductor die 10 is shown during a wire bonding process. The semiconductor die 10 has been attached to a die mounting paddle 12 of a leadframe 14. The semiconductor die 10 includes a plurality of bond pads 18 which connect to various integrated circuits formed on the die 10. The leadframe 14 includes an arrangement of lead fingers 16 which will ultimately become the external leads of the completed semiconductor package. During the wire bonding process, fine bond wires 26 are bonded to the bond pads 18 and to bond sites 20 on the lead fingers 16.

For teaching the location of a bond site 20' on particular lead finger 16', the locations of the lateral edges 22', 24' of the lead finger 16' are sensed by the vision system of the wire bonding apparatus. The wire bonding apparatus is then programmed to determine a midpoint between the edges 22, 24 of the lead finger 16'. This is the dimension "Y" in FIG. 1. Accordingly, axis 28' is the longitudinal axis of the lead finger 16'. Following this determination, the bonding tool of the wire bonding apparatus is programmed to move along the longitudinal axis 28' of the lead finger 16', a predetermined distance "X" from the appropriate bond pad 18 on the semiconductor die 10, to locate the bond site 20' and make the bond.

A problem with this method of teaching or locating the bond site 20' on the lead finger 16' is that the location of the lead finger 16' with respect to the die 10 my vary from die to die. As an example, the location of the die 10 on the mounting paddle 12 may vary by up to 10 mils in any direction from the nominal position. The distance "X" is therefore imprecise. In addition, more bond wire than necessary tends to be used in order to insure that the bond site 20 will be located on the lead finger 16.

In view of these shortcomings of the prior art, it is an object of the present invention to provide an improved method for wire bonding semiconductor dice to the lead fingers of a leadframe and for teaching a bond site location on a lead finger during wire bonding. It is a further object of the present invention to provide an improved method for precisely locating a bond site along a longitudinal axis of a lead finger a predetermined distance from a terminal edge of a tip portion of the lead finger during wire bonding. It is a yet another object of the present invention to provide a wire bonding method in which a length of the bond wire is controlled during the wire bonding process and less bond wire is used. It is a further object of the present invention to provide an improved wire bonding method that is simple, efficient, and adaptable to large scale semiconductor manufacture.

SUMMARY OF THE INVENTION

In accordance with the invention an improved method for teaching a bond site location on a lead finger of a semiconductor [leadfree] *leadframe* during a wire bonding process is provided. In a wire bonding process, bond pads formed on a semiconductor die are bonded to lead fingers on a leadframe using fine bond wires. The method of the invention, broadly stated, comprises locating a bond site on the lead finger along a longitudinal axis of the lead finger a predetermined distance from a terminal edge of a tip portion of the lead finger. The predetermined distance between the bond site and the terminal edge is equal to the distance between a lateral edge of the lead finger and a longitudinal axis of the lead finger. Stated differently, the predetermined distance is equal to the width of a lead finger divided by two.

More particularly stated, the method of the invention includes the following steps: sensing a location of the terminal edge and lateral edges of a tip portion of a lead finger of a leadfree; determining a distance from a lateral edge of the lead finger to a longitudinal axis of the lead finger; locating a bond site along the longitudinal axis and spaced from the terminal edge of the lead finger by the predetermined distance.

These and other objects, features and advantages of the invention will be apparent from the following more particular description of the invention as illustrated in the accompanying drawings.

DETAILED DESCRIPTION OF THE PREFERRED EMBODIMENTS

Figure 1:
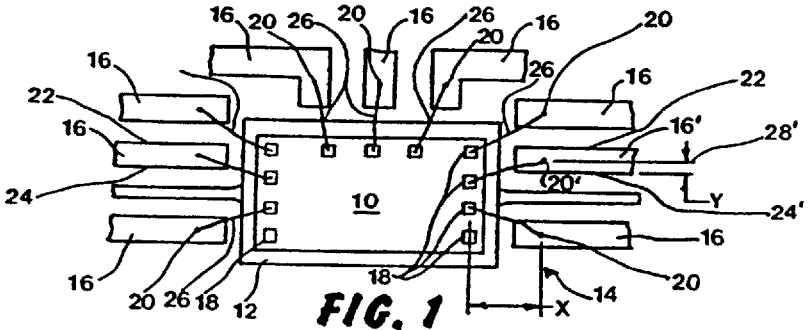
FIG. 1 (PRIOR ART)
FIG. 1 is a schematic plan view of a semiconductor die and lead fingers of a leadfree shown during a prior art wire bonding process.
Figure 2:
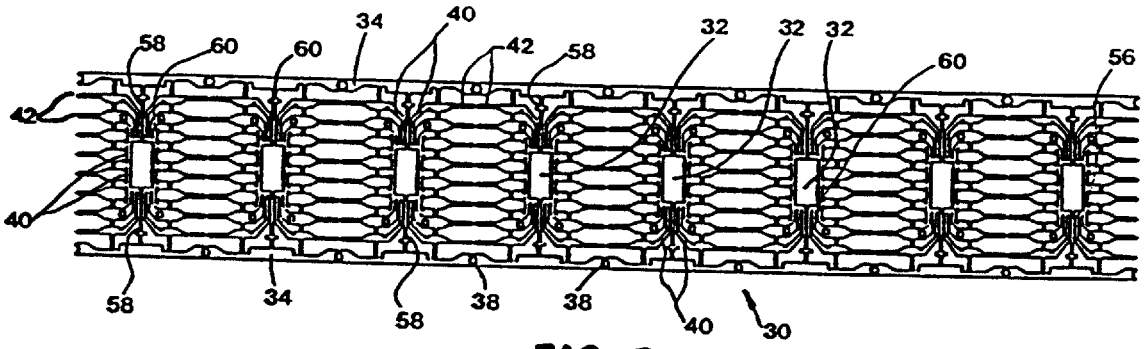
FIG. 2 (PRIOR ART)
FIG. 2 is a plan view of a prior art semiconductor leadfree strip.

A typical leadframe strip 30 used in semiconductor manufacture is depicted in FIG. 2. The leadframe strip 10 is adapted to mount several semiconductor dice (i.e. eight dice) for packaging. The leadframe strip 30 includes parallel spaced strip rails 34 formed with a pattern of openings 38 for handling by automated machinery. In addition, the [leadfree] *leadframe* strip 30 includes die mounting paddles 32 for mounting the individual semiconductor dice (not shown) to the leadframe strip 30. The die mounting paddles 32 have a generally rectangular peripheral configuration which matches the peripheral configuration of a semiconductor die. Mounting paddle connecting members 58 attached to the strip rails 34 connect and support the mounting paddles 32 on the [leadfree] *leadframe* strip 30.

From the point in the manufacturing process in which the die mounting paddles 32 are coated with adhesive for die bonding, until the point in which the individual semiconductor packages or chips are separated from the leadframe strip rails 34 during a trim and form process, a leadframe strip 30 is treated as a unit in the manufacturing process.

The leadframe strip [10] *30* also includes an arrangement of lead fingers 40. Each die mounting paddle 32 has an associated set of lead fingers 40 which surround the generally rectangular shaped mounting paddle 32. Each lead finger 40 includes a distal end 42 which following encapsulation of the die, will become the external lead of a completed semiconductor package. In addition, each lead finger 40 includes a proximal end or tip portion 60 for bonding to a bond wire during the wire bonding process. A terminal edge 56 (FIG. 3) of the tip portion 60 of each lead finger 42 is located adjacent to and generally parallel to an edge of the die mounting paddle 32. The tip portions 60 of each set of lead fingers 40 for a die mounting paddle 32 circumscribe the generally rectangular periphery of the die mounting paddle 32. The terminal edges 56 of the tip portions 60 of the lead fingers 40 are generally parallel to either a longitudinal edge 64 (FIG. 3) or a lateral edge 66 (FIG. 3) of the die mounting paddles 32.

Figure 3:
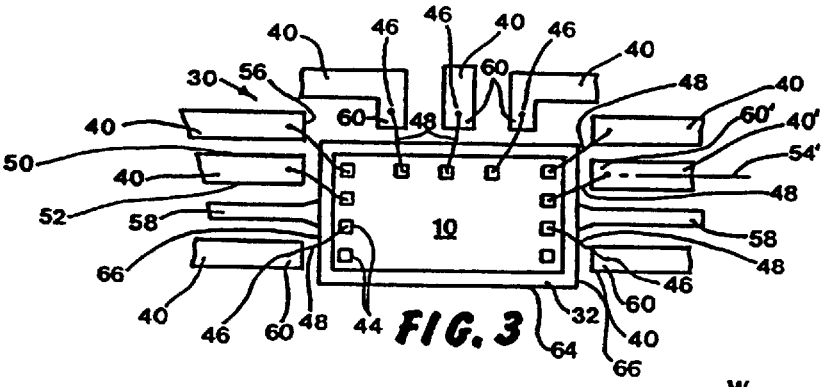
FIG. 3 is a schematic plan view of a semiconductor die and lead fingers of a leadframe shown during a wire bonding process in accordance with the method of the invention.

With reference to FIG. 3, a semiconductor die 10 wire bonded in accordance with the invention is shown. Prior to the wire bonding process the semiconductor die 10 is attached to a mounting paddle 32 of the [leadfree] *leadframe strip* 30. During the wire bonding process bond pads 44 formed on the die 10 are attached to bond sites 46 on the lead fingers 40 using fine bond wires 48 substantially as previously described.

The wire bonding process can be performed utilizing an automated wire bonding apparatus. One suitable automated wire bonding apparatus is manufactured by Kulicke and Soffa Industries, Inc., Horsham, Pa. and is designated as a Model No. 1484 wire bonder. Other suitable automated wire bonding apparatus are manufactured by ESEC, Shinkawa, and Kiajo Denki. Such automated wire bonding apparatus typically include an automated vision sensing system. In addition to a vision sensing system, such automated wire bonding apparatus typically include a computer control system for controlling various aspects of the wire bonding process. Instructions for operation of the computer are encoded on suitable computer software. The present invention is directed to a method for precisely locating the bond sites 46 on the lead fingers 40 utilizing such an automated wire bonder.

Figure 4:
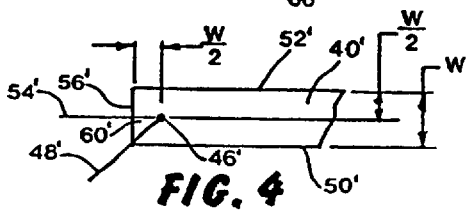
FIG. 4 is an enlarged view of a portion of FIG. 3 showing a terminal edge of tip portion of a lead finger.

With reference to FIG. 4, the method of the invention can be explained by referring to a particular lead finger 40'. In accordance with the invention, the location of a bond site 46' on the tip portion 60' of the lead finger 40' is taught. In general the term "teach" or "taught" is used in the art to refer to the step in the wire bonding process wherein a bond site location is ascertained and the wire bonding tool of the wire bonding apparatus is instructed to complete a bond at that location. As previously explained, the bond site 46' is for the second bond performed for each bond wire 48'. A first bond is the bond between the bond wire 48' and the appropriate bond pad 44 (FIG. 3) of the die 10.

The method of the invention includes the following steps:

1. Sensing a location of the lateral edges 50', 52', and a terminal edge 56' of the tip portion 60' of the lead finger 40' using a vision sensing system of an automated wire bonding apparatus.

2. Determining a location of the longitudinal axis 54' of the tip portion 60' of the lead finger 40' using the vision sensing system. This determination is made by determining the width "W" of the lead finger 40' at the tip portion 60' and dividing the width by two. Because the lateral edges 50', 52' are generally parallel to one another, the longitudinal axis 54' is thus equidistant from each lateral edge 50', 52' of the tip portion 60' by a predetermined distance "W/2".

3. Teaching a location of a bond site 46' by locating the bond site 46' along the longitudinal axis 54' of the tip portion 60' of the lead finger 40' and spaced the predetermined distance W/2 from the terminal edge 56' of the tip portion 60'.

An existing automated wire bonder, such as the wire bonders previously identified, can be modified to perform the method of the invention by appropriate changes in the software for the computer control of the wire bonding apparatus. In general, such software modifications are dependent on the particular software for the wire bonding apparatus and can be accomplished by techniques that are known in the art.

By precisely locating the bond site 46', a set distance from the terminal edge 56' of the tip portion 60' of a selected lead finger 40', cost savings in bonding wire 48' can be realized. As an example, the bond wire 48' can be made approximately 0.005 inches shorter utilizing the method of the invention as compared to conventional methods of wire bonding. For a large scale semiconductor manufacturer, such as the assignee hereunder, this may amount to a savings of several hundred spools of bond wire 48' in a years time. As the bond wire 48' is typically fabricated of expensive gold wire, this is a significant cost saving. Furthermore, the method of the invention insures that the location of the bond site 46' is consistent between different wire bonding apparatus and for different operators of the same wire bonding apparatus.

Thus the method of the invention provides a simple yet unobvious method for wire bonding and for teaching the location of a bond site on a lead finger of a leadframe. Although the invention has been described in terms of a preferred embodiment, it is intended that alternate embodiments of the inventive concepts expressed herein be included within the scope of the following claims.

What is claimed is:

[1. In a wire bonding process, in which a bond wire is bonded to bond pads formed on a semiconductor die and then to a bond site located on a tip portion of a lead finger of a semiconductor leadframe, utilizing an automated wire bonding apparatus, a method for teaching a location of the bond site on the lead finger, said method comprising the steps of:

sensing a location of the lateral edge and a terminal edge of the tip portion of the lead finger using an automated vision sensing system of the wire bonding apparatus;

determining a location of a longitudinal axis of the tip portion of the lead finger; and then locating the bond site on the lead finger along the longitudinal axis of the lead finger and spaced by a predetermined distance from the terminal edge.]

[2. The method as recited in claim 1 and wherein the location of the longitudinal axis of the tip portion of the lead finger is determined by determining the width "W" of the lead finger and then dividing by two.]

[3. The method as recited in claim 2 and wherein the predetermined distance is equal to "W/2".]

[4. The method as recited in claim 3 and wherein the wire bonding apparatus is an existing wire bonding apparatus having software modified to determine the location of the longitudinal axis and locate the bond site.]

5. A wire bonding method for semiconductor manufacture comprising:

providing a semiconductor die having a plurality of bond pads thereon connected to integrated circuits formed on the die;

providing a semiconductor leadframe having a plurality of generally rectangular shaped die mounting paddles each surrounded by an arrangement of lead fingers, each of said lead fingers including a tip portion located at a proximal end thereof with a terminal edge of each tip portion generally parallel to a side of a mounting paddle;

attaching the die to a mounting paddle;

bonding a fine bond wire to a bond pad of the die using a bonding tool of an automated wire bonding apparatus having an automated vision system for sensing a location of the die and lead fingers;

determining a width (W) of the tip portion of a selected lead finger and a longitudinal axis of the selected lead finger using the automated vision system;

locating a bond site on the tip portion of the selected lead finger generally along the longitudinal axis and spaced from the terminal edge of the selected lead finger by a predetermined distance; and bonding the fine bond wire to the selected lead finger at the bond site using the bonding tool.

6. The bonding method as recited in claim 5 and wherein the predetermined distance is equal to the width (W) of the tip portion of the selected lead finger divided by two (W/2).

7. The bonding method as recited in claim 6 and wherein the wire bonding apparatus includes a computer control system operated by computer software.

8. The bonding method as recited in 7 and wherein the wire bonding apparatus is an existing apparatus and the computer software is modified for determining the width (w) and longitudinal axis of the tip portion of the selected lead finger and for locating the bond site the predetermined distance (W/2) from the terminal edge.

[9. In semiconductor manufacture, a method for wire bonding a bond pad on a die to a bond site located on a tip portion of a selected lead finger of a leadframe, said method comprising:

providing a semiconductor leadframe having a plurality of generally rectangular shaped die mounting paddles each surrounded by an arrangement of lead fingers, each of said lead fingers including a tip portion located at a proximal end thereof having generally parallel lateral edges and a terminal edge generally parallel to a side of a mounting paddle;

sensing the location of the lateral edges and terminal edge of the selected lead finger and determining the location of a longitudinal axis of the selected lead finger; and locating the bond site along the longitudinal axis and spaced from the terminal edge by a predetermined distance.]

[10. The method as recited in claim 9 and wherein the predetermined distance is equal to the width of the tip portion of the selected lead finger divided by two.]

*11. A semiconductor device wire bonding method, comprising:*

*providing a semiconductor die having a plurality of bond pads thereon connected to integrated circuits formed on the semiconductor die;*

*providing a semiconductor leadframe strip having a plurality of die mounting sites, each mounting site having an associated arrangement of lead fingers including tip portions;*

*attaching the semiconductor die to the semiconductor leadframe strip at a mounting site;*

*bonding a fine bond wire to a bond pad of the semiconductor die;*

*determining a previously unverified width (W) at the tip portion of a selected lead finger and determining a longitudinal axis of the tip portion of the selected lead finger;*

*locating a bond site on the tip portion of the selected lead finger generally along the longitudinal axis and spaced from a terminal edge of the selected lead finger by a distance determined as a function of width (W) as determined; and*

*bonding the fine bond wire to the selected lead finger substantially at the bond site.*

*12. The bonding method as recited in claim 11 and wherein the distance by which the bond site is spaced from the terminal edge of the selected lead finger is equal to the width (W) of the tip portion of the selected lead finger as determined divided by two (W/2).*

*13. In a wire bonding process, in which a bond wire is bonded to bond pads formed on a semiconductor die and*

*then to a bond site located on a tip portion of a lead finger of a semiconductor leadframe, utilizing an automated wire bonding apparatus, a method for teaching a location of the bond site on the lead finger, said method comprising the steps of:*

*sensing a location of lateral edges and a terminal edge of the tip portion of the lead finger using an automated vision sensing system of the automated wire bonding apparatus;*

*determining a location of a longitudinal axis of the tip portion of the lead finger by determining a width "W" of the lead finger and then dividing by two; and then*

*locating the bond site on the lead finger along the longitudinal axis of the lead finger and spaced by a predetermined distance equal to "W/2" from the terminal edge.*

*14. The method as recited in claim 13 and wherein the automated wire bonding apparatus is an existing wire bonding apparatus having software modified to determine the location of the longitudinal axis and locate the bond site.*

*15. In semiconductor manufacture, a method for wire bonding a bond pad on a die to a bond site located on a tip portion of a selected lead finger of a leadframe, said method comprising:*

*providing a semiconductor leadframe having a plurality of generally rectangular shaped die mounting paddles each surrounded by an arrangement of lead fingers, each of said lead fingers including a tip portion located at a proximal end thereof having generally parallel lateral edges and a terminal edge generally parallel to a side of a mounting paddle;*

*sensing the location of the lateral edges and terminal edge of the selected lead finger and determining the location of a longitudinal axis of the selected lead finger; and*

*locating the bond site along the longitudinal axis and spaced from the terminal edge by a predetermined distance equal to the width of the tip portion of the selected lead finger divided by two.*

*16. A process for bonding a wire to a bond site located on a tip portion of a lead finger of a semiconductor leadframe, comprising:*

*sensing a location of lateral edges and a terminal edge of the tip portion of the lead finger;*

*determining a location of a longitudinal axis of the tip portion of the lead finger by determining a width "W" of the lead finger and then dividing by two;*

*locating the bond site on the lead finger along the longitudinal axis and spaced by a distance equal to "W/2" from the terminal edge; and*

*bonding the wire to the lead finger substantially at the bond site.*

*17. A method for bonding a wire to a bond site located on a tip portion of a selected lead finger of a leadframe, comprising:*

*providing a semiconductor leadframe having at least one die mounting site with an associated arrangement of lead fingers, said lead fingers including tip portions having generally parallel lateral edges and a terminal edge;*

*sensing the location of the lateral edges and a terminal edge of the selected lead finger and determining the location of a longitudinal axis of the selected lead finger tip portion;*

*locating the bond site along the longitudinal axis and spaced from the terminal edge by a distance equal to a width of the tip portion of the selected lead finger divided by two; and*

*bonding a bond wire to the selected lead finger substantially at the bond site.*

*18. A process for bonding a wire to a bond site located on an end portion of a conductor of a carrier for a semiconductor die, comprising:*

*sensing a location of lateral edges and a terminal edge of the end portion of the conductor;*

*determining a location of a longitudinal axis of the end portion of the conductor;*

*locating the bond site on the conductor along the longitudinal axis of the conductor end portion and spaced by a distance from the terminal edge equal to a width of the end portion of the conductor divided by two; and*

*bonding the wire to the conductor substantially at the bond site.*

*19. The method as recited in claim 18, further comprising:*

*bonding the wire to a bond pad on said semiconductor die.*

* * * * *

UNITED STATES PATENT AND TRADEMARK OFFICE

CERTIFICATE OF CORRECTION

PATENT NO. : RE 37,396 E
DATED : October 2, 2001
INVENTOR(S) : Rich Fogal

It is certified that error appears in the above-identified patent and that said Letters Patent is hereby corrected as shown below:

Column 1,
Line 21, delete the first paragrah after the heading of "BACKGROUND OF THE INVENTION" and replace it with the following two paragraphs:

-- In the semiconductor manufacture a wire bonding process is used to electrically conect bond pads formed on semiconductor dice to the lead fingers of a leadframe strip. Apparatus for wire bonding semiconductor dice are well known in the art. U.S. Pat. No. 3,894,671 to Kulicke Jr. et al; 4,877,173 to Fujimoro et al; and 5,082,165 to Ishizuka; disclose representative wire bonding apparatus.

In a conventional semiconductor packaging process, several semiconductor dice are attached to a leadframe strip. During the wire bonding process, each die is held between a wire bonding clamp and a wire bonding heat block of the wire bonding apparatus. The heat block heats the semiconductor die and the lead frame to a temperature of about 300º C. to 400º C. A bonding tool then mechanically presses a fine bond wire to a bond pad of the die and then to a bonding site on an appropriate lead finger. --

Column 2,
Line 25, after "die 10" change "my" to -- may --

Signed and Sealed this

Twenty-first Day of September, 2004

JON W. DUDAS
*Director of the United States Patent and Trademark Office*